United States Patent [19]

Xu et al.

[11] Patent Number: 4,845,541
[45] Date of Patent: Jul. 4, 1989

[54] TUNNELING EMITTER BIPOLAR TRANSISTOR

[75] Inventors: Jingming Xu, Minneapolis; Michael Shur, Golden Valley, both of Minn.

[73] Assignee: Regents of the University of Minnesota, Minneapolis, Minn.

[21] Appl. No.: 204,959

[22] Filed: Jun. 6, 1988

Related U.S. Application Data

[63] Continuation of Ser. No. 868,785, May 29, 1986, abandoned.

[51] Int. Cl.⁴ .................. H01L 27/12; H01L 29/161; H01L 29/72
[52] U.S. Cl. ........................................ 357/34; 357/4; 357/7; 357/16; 357/61
[58] Field of Search ...................... 357/16, 34, 4, 7, 61

[56] References Cited

U.S. PATENT DOCUMENTS

| | | | |
|---|---|---|---|
| 4,163,237 | 7/1979 | Dingle et al. ......................... | 357/22 |
| 4,286,275 | 8/1981 | Heiblum ................................ | 357/16 |
| 4,380,774 | 7/1983 | Yoder .................................... | 357/16 |
| 4,672,404 | 6/1987 | Ankri et al. ........................... | 357/4 |
| 4,672,413 | 6/1987 | Gardner ................................ | 357/16 |
| 4,679,305 | 7/1987 | Morizuka .............................. | 357/16 |
| 4,691,215 | 9/1987 | Luryi .................................... | 357/34 |

OTHER PUBLICATIONS

M. Heiblum et al., "Ballistic Elements in Semiconductors", *Scientific American*, vol. 256, (Feb. 1987), pp. 102–111.

S. Luryi, "An Induced Base Hot-Electron Transistor", *IEEE Electron Letters*, vol. EDL-6, (Apr. 1985), pp. 178–180.

Asbeck, P., D. Miller, R. Milano, J. Harris, Jr., G. Kaelin and R. Zucca, "(Ga,Al)As/GaAs Bipolar Transistors for Digital Integrated Circuits," *IEDM* 81, pp. 629–632, 1981.

Chand, Naresh and Hadis Morkoc, "Doping Effects and Compositional Grading in $Al_xGa_{l-x}As/GaAs$ Heterojunction Bipolar Transistors," *IEEE Transaction on Electron Devices*, vol. Ed-32, No. 6, pp. 1064–1068, Jun. 1985.

Grinberg, Anotoly A., M. Shur, R. Fischer and H. Morkoc, "An Investigation of the Effect of Graded Layers and Tunneling on the Performance of AlGaAs/GaAs Heterojunction Bipolar Transistors," *IEEE Transaction on Electron Devices*, vol. Ed-31, No. 12, pp. 1758–1764, Dec. 1984.

Kroemer, Herbert, "Heterostructure Bipolar Transistors: What Should we Build?" *J. Vac. Sci. Technol.*, B1(2), pp. 126–130, Apr./Jun. 1983.

Yuan, H. T., W. V. McLevige and H. D. Shih, "GaAs Bipolar Digital Integrated Circuits," *VLSI Electronics*, vol. 11, ed. by N. Einspurch and W. Wisseman, Academic Press, Inc. 1985.

*Primary Examiner*—J. Carroll
*Attorney, Agent, or Firm*—Kinney & Lange, P.A.

[57] ABSTRACT

A bipolar transistor has a barrier layer interposed between its base and its emitter. The barrier layer is formed of a different, wider band gap, semiconductor material than the base and the emitter and has the same conductivity type as the emitter. The barrier layer exhibits a large difference in the effective electron mass and the effective whole mass, and presents a small barrier to majority carriers. The tunneling emitter bipolar transistor exhibits a comparable current gain while having better temperature stability, less light sensitivity, and a much lower emitter resistance (leading to a much higher cut-off frequency) than conventional heterojunction bipolar transistors.

19 Claims, 2 Drawing Sheets

TUNNELING EMITTER BIPOLAR TRANSISTOR

This is a continuation of application Ser. No. 868,785 filed May 29, 1986 (now abandoned).

BACKGROUND OF THE INVENTION

1. Field of the Invention

The present invention relates to bipolar transistors. In particular, the present invention is an improved bipolar transistor which includes a thin barrier layer of a wider band gap semiconductor material between the base and emitter.

2. Description of the Prior Art

The desire for higher speed bipolar transistors has led to the investigation of various transistor structures, and to the development of bipolar transistors using semiconductor materials other than silicon. Particular emphasis has been placed on devices using gallium arsenide (GaAs). Among the advantages offered by gallium arsenide over silicon transistors are the higher electron mobility of gallium arsenide, the availability of semi-insulating substrates, and expected superior radiation hardness and high temperature performance.

Heterojunction bipolar transistors (HBT), which typically use a wide band gap aluminum gallium arsenide (AlGaAs or $Al_xGa_{1-x}As$) emitter, offer several potential advantages over homojunction GaAs devices for high speed applications. In a AlGaAs/GaAs heterojunction bipolar transistor, the wide band gap AlGaAs emitter introduces an extra barrier for minority carrier injection from base to emitter. As a result, the emitter efficiency can be very high and nearly independent of the doping density of the base. As a result, the base can be doped heavily to reduce base resistance, without sacrificing emitter injection efficiency. Description of heterojunction bipolar transistors can be found, for example, in the following papers: H. Kroemer, "Heterostructure Bipolar Transistors: What Should We Build?", *J. Vac Sci. Technol.*, Bl(2), pp. 126-130, April-June 1983; N. Chand and H. Morkoc, "Doping Effects and Compositional Grading in $Al_xGa_{1-x}As$/GaAs Heterojunction Bipolar Transistors", *IEEE Transactions on Electron Devices*, Vol. Ed-32, No. 6, pp 1064–1068, June 1985; A. Grindberg, M. Shur, R. Fischer and H. Morkoc, "An Investigation of the Effect of Graded Layers and Tunneling on the Performance of AlGaAs/GaAs Heterojunction Bipolar Transistors", *IEEE Transactions on Electron Devices*, Vol. Ed-31, No. 12, pp 1758-1764, December 1984; P. Asbeck, D. Miller, R. Milano, J. Harris, Jr., G. Kaelin and R. Zucca, "(Ga,Al)As/GaAs Bipolar Transistors For Digital Integrated Circuits", *IEDM* 81, pp 629-632, 1981.

Despite the advantages, AlGaAs/GaAs heterojunction bipolar transistors also have significant shortcomings. In particular, the AlGaAs emitter has several disadvantages related to the traps associated with the dopants, high contact resistance (typically much larger than for comparably doped GaAs), and higher series resistance because of the low mobility and electron velocity in AlGaAs.

SUMMARY OF THE INVENTION

The present invention is a new bipolar transistor which we call a tunneling emitter bipolar transistor (TEBT). This device uses a thin barrier layer of a wider band gap semiconductor material interposed between the base and emitter of a bipolar transistor. The barrier layer exhibits a large difference in effective electron mass and effective hole mass. The barrier layer, which has the same conductivity type as the emitter, preferably has a graded compositional profile so that the energy gap increases with distance from the base. The compositional profile, along with high doping levels of the emitter and the barrier layer, provides a barrier which is smaller and thinner for majority carriers than for the minority carriers in the emitter.

The TEBT provides improved emitter efficiency because of the mass filtering and the effect of the larger barrier to minority carrier injection, and low emitter series resistance, resulting in high current gain and high cutoff frequency, while considerably reducing the undesirable effects of the emitter of a conventional HBT. Hence the TEBT has much better temperature stability and less light sensitivity.

DETAILED DESCRIPTION OF THE PREFERRED EMBODIMENTS

Figure 1A:
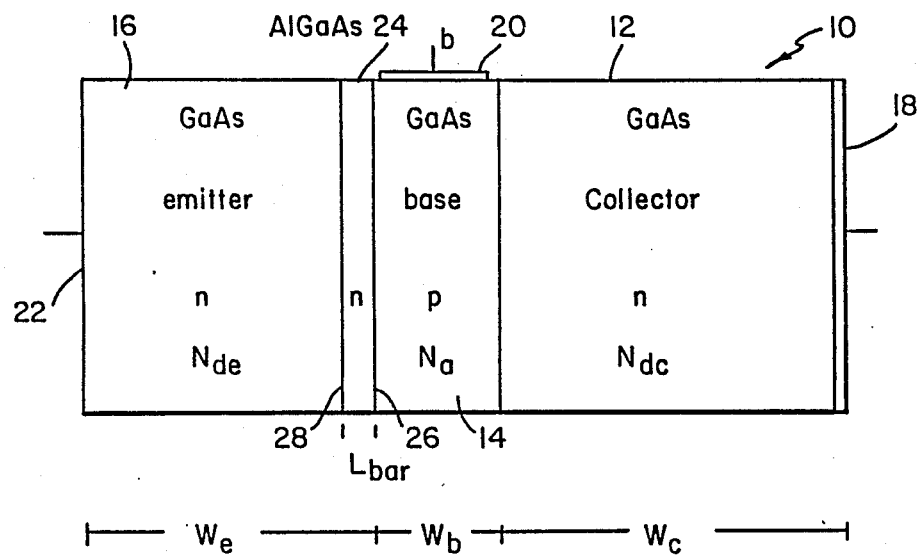
FIG. 1A is a diagram showing a preferred embodiment of the tunneling emitter bipolar transistor of the present invention.

FIG. 1A is a schematic cross-section of tunneling emitter bipolar transistor 10 of the present invention. TEBT 10, in this embodiment, is an NPN transistor having an N type collector 12, a heavily doped P type (P+) base 14 and a heavily doped N type (N+) emitter 16. Collector contact 18, base contact 20, and emitter contact 22 make ohmic contact to collector 12, base 14 and emitter 16, respectively.

Figure 1B:
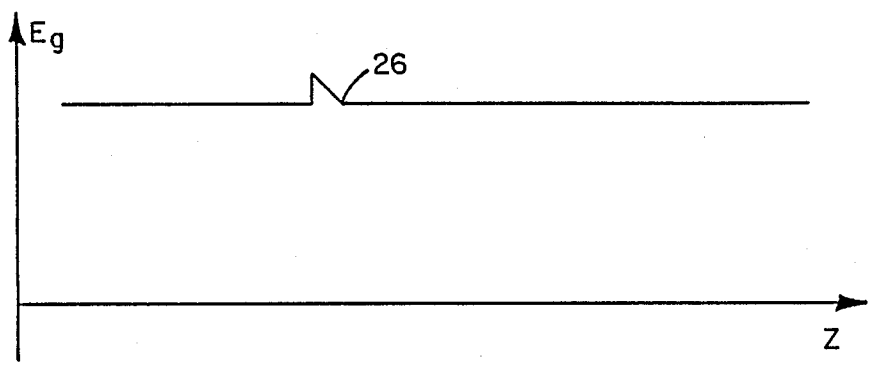
FIG. 1B is a diagram showing the energy gap as a function of position along the TEBT of FIG. 1A.

TEBT 10 also includes a thin barrier layer 24 which is interposed between base 14 and emitter 16. Barrier layer 24, which is a heavily doped N type layer, has a different composition than base 14 and emitter 16. In one preferred embodiment, collector 12, base 14 and emitter 16 are all gallium arsenide, while barrier layer 24 is a thin $Al_xGa_{1-x}As$ alloy semiconductor layer. The thickness of barrier layer 24 varies from about 10 Angstroms to about 200 Angstroms, depending on the value of x (the mole fraction of AlAs in the alloy semiconductor), the composition profile of barrier layer 24, and the doping levels of base 14, emitter 16 and barrier layer 24. In preferred embodiments, barrier layer 24 is between about 30 Angstroms and about 60 Angstroms. Barrier layer 24 is preferably graded to make the barrier smaller for injected electrons (majority carriers), while the barrier for holes (minority carriers) remains basically unchanged when emitter 16 is doped heavily. As shown in FIG. 1B, the energy gap $E_g$ increases with distance from junction 26. This is achieved by grading the composition of the barrier layer so that x increases with distance from junction 26. The graded composition also eliminates a sharp notch which otherwise exists at the emitter base junction.

TEBT 10 achieves enhanced emitter injection efficiency by taking advantage of a very large difference in the tunneling probabilities for electrons and holes in barrier layer 24. The improvement results from both the effect of "mass filtering" (because there is a large difference in the effective electron mass and the effective hole mass in barrier layer 24), and the effect of a large barrier to minority carrier injection and a small barrier to majority carrier injection.

Table 1 shows the characteristics and parameters of a TEBT device like the one shown in FIG. 1A. In this device, collector 12, base 14, and emitter 16 are all GaAs, while barrier layer 24 is an $Al_xGa_{1-x}As$ layer having a compositional profile in which x changes from zero at junction 26 to about 0.332 at interface 28 between barrier layer 24 and emitter 16.

TABLE 1

| | |
|---|---|
| At Temperature: | T = 300K |
| Doping densities: | $N_{de} = 2 \times 10^{18}$; $N_a = 0.8 \times 10^{18}$; $N_{dc} = 5 \times 10^{16}$ (1/cm³) |
| $Al_xGa_{1-x}As$ layer thickness: | $L_{bar}$ = 200 Angstroms |
| Composition profile x: | x changes linearly from 0.332 at interface 28 to 0 at junction 26 |
| Lengths: | $W_e$ = 0.45 μm; $W_b$ = 0.05 μm; $W_c$ = 0.5 μm |
| Mobilities: | $\mu_p$ = 136 cm²/v.s, $\mu_n$ = 2470 cm²/v.s |
| Life time: | $\tau_{be} = 5 \times 10^{-7}$ s |
| Intrinsic concentration: | $n_i = 2 \times 10^6$/cm³ |
| Width of depletion region in e-b junction: | $W_{be}$ = 0.04 μm |

Figure 2B:
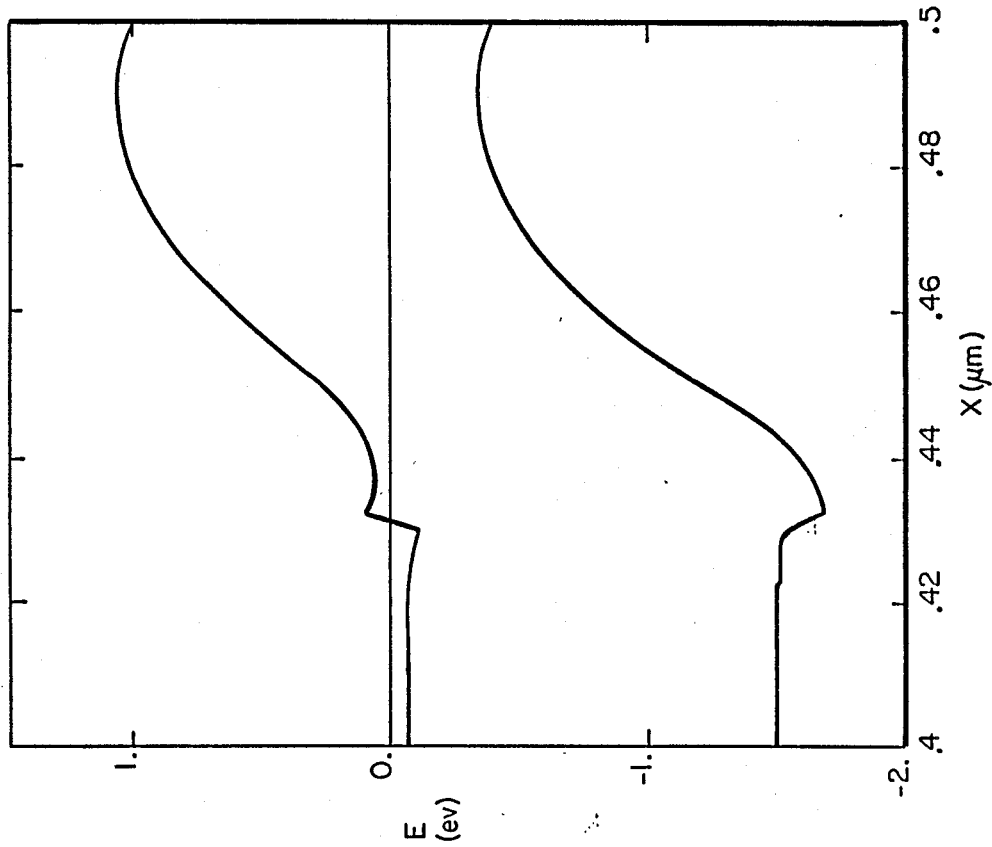
FIG. 2B shows a portion of the band structure of FIG. 2A, in expanded scale, around the emitter base junction.
Figure 2A:
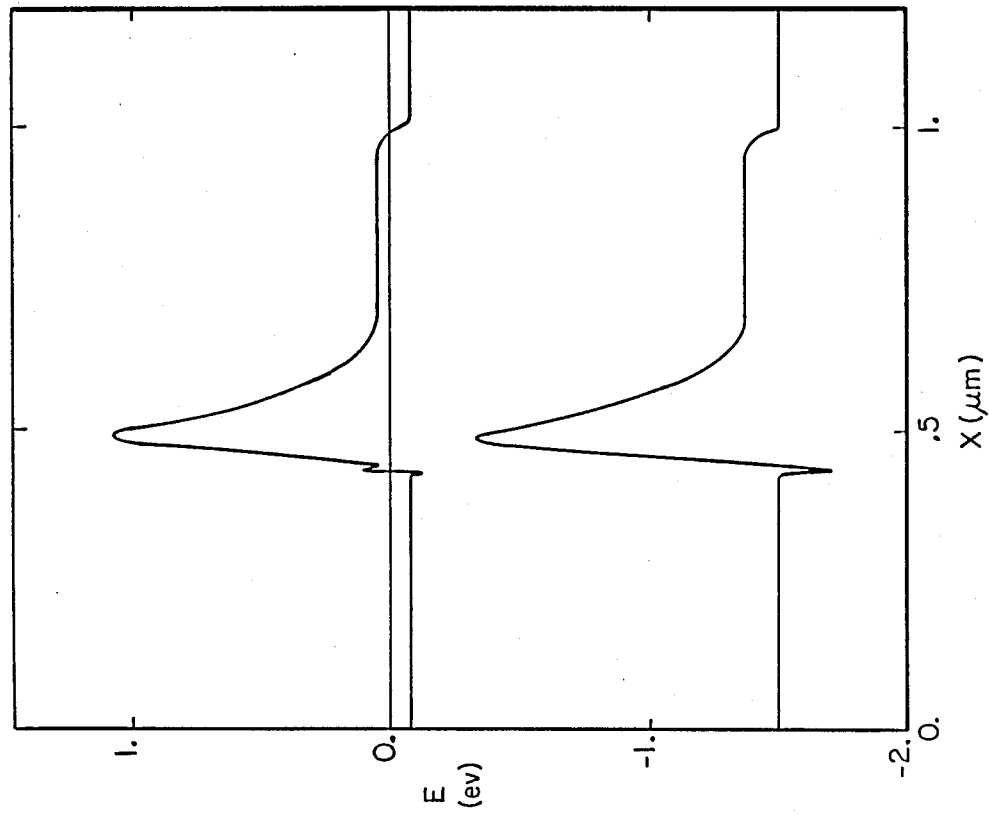
FIG. 2A is a diagram showing the band structure of the TEBT at thermal equilibrium.

FIG. 2A shows a numerically calculated band diagram of TEBT device 10 using the device parameters given in Table 1. The conduction band discontinuity was assumed to be $\Delta E_c = 0.57 \Delta E_g$ where $\Delta E_g$ is the band gap difference between $Al_xGa_{1-x}As$ and GaAs.

An expanded view of the region around the emitter-base junction 26 is shown in FIG. 2B. The effective barrier for the conduction electrons is only a fraction of $\Delta E_c(x)$; but the effective barrier for holes is even slightly larger than $\Delta E_v(x)$. Also, the electron effective mass is smaller than the hole effective mass. Hence, the conduction electrons can tunnel through the $Al_xGa_{1-x}As$ barrier layer 24 much easier than holes. Indeed, when the tunneling probability T is much smaller than 1, the following expression $$T = \exp(-2 \int [2m^*(V(x)-E)/\rho^2]^{\frac{1}{2}} dx) \quad \text{Eq 1}$$

can be used as a good approximation. For a uniform $Al_{0.3}Ga_{0.7}As$ material, the electron effective mass is about 0.092 $m_e$, heavy hole ($\approx 93\%$) effective mass about 0.66 $m_e$, and light hole ($\approx 7\%$) effective mass about 0.11 $m_e$.

An accurate quantitative calculation of the tunneling probabilities of electrons and holes requires very accurate knowledge of the shape of the barriers and the values of the effective masses. In addition, the grading of the composition in the $Al_xGa_{1-x}As$ barrier layer 24 further complicates the evaluation of the effective masses.

Using approximated trapzoid barrier shapes, the average tunneling probability for holes $T_p$ can be estimated as $$T_p \leq 10^{-4} \quad \text{Eq 2}$$

and the estimated $T_n$ for electrons is about $$T_n \approx 0.1 \quad \text{Eq 3}$$

which can be further increased by varying the composition and doping profiles.

Taking the thermionic emission effects into account, the transport rates through barrier layer 24 may be written as $$R_p = T_p + (1-T_p)\exp(-E_v kT) \approx \exp(-\Delta E_v/kT) \quad \text{Eq 4}$$

$$R_n = T_n + (1-T_n)\exp(-\Delta E'_c/kT) \quad \text{Eq 5}$$

for holes and electrons respectively, where $\Delta E_v \approx 0.11$ eV is the valence band discontinuity, and $\Delta E'_c \approx 0.77$ eV is the effective barrier height for electrons.

Figure 3:
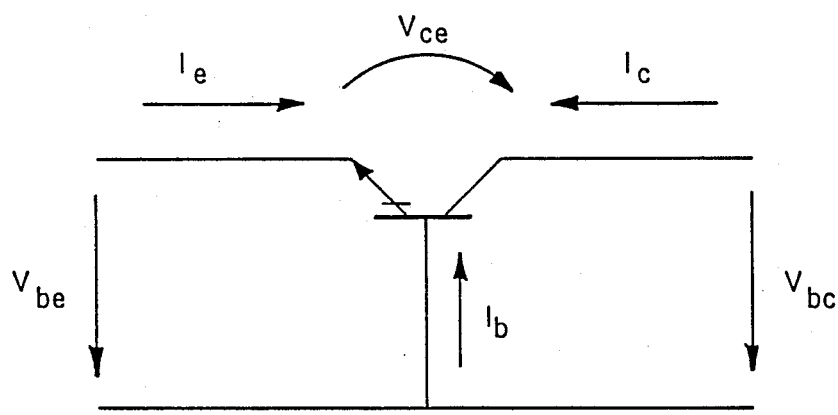
FIG. 3 is a diagram showing terminal voltage and current conventions of the tunnelling emitter bipolar transistor.

FIG. 3 shows a diagrammatic representation of TEBT 10, with terminal voltage and current conventions illustrated. TEBT 10 is shown symbolically in a fashion similar to a conventional bipolar transistor, except that a small line crosses the emitter arrow to dictate the presence of barrier layer 24.

Following a conventional procedure described in H. T. Yuan, W. V. McLevige, and H. D. Shih, "GaAs Bipolar Digital Integrated Circuits", *VLSI Electronics*, Vol. 11, ed. by N. Einspruch and W. Wisseman, Academic Press, Inc., 1985, and taking $R_p$ and $R_n$ into consideration, the first order I-V characteristic of TEBT 10 for the n-p-n structure with terminal voltages and currents shown in FIG. 3 may be described by the Ebers-Moll model:

$$I_e = -I_{es}[\exp(qv_{be}/kT)-1)] + \alpha_{dr}I_{cs}[\exp(qV_{bc}/kT)-1] + \alpha_r I_{cs}[\exp(qV_{bc}/kT)-1] - I_{er} \quad \text{Eq 6A}$$

$$I_c = -\alpha_f I_{es}[\exp(qV_{be}/kT)-1)] - I_{cs}[\exp(qV_{bc}/kT)-1] - I_{cr}, \quad \text{Eq 6B}$$

where the recombination currents $$I_{er} = A_e(qn_iW_{be}/\tau_{be})[\exp(qV_{be}/nkT)-1] \quad \text{Eq 7A}$$

$$I_{cr} = A_c(qn_iW_{bc}/\tau_{bc})[\exp(qV_{bc}/nkT)-1] \quad \text{Eq 7B}$$

are included.

To reduce $I_{er}$, the compositional profile of barrier layer 24 may be graded symmetrically rather than linearly as shown in FIG. 1B.

The parameters $I_{es}$ and $I_{cs}$ are the emitter-base and collector-base junction reverse bias saturation currents contributed by both the electron component and hole component, that is $$I_{es} = I_{es}(p) + I_{es}(n) \quad \text{Eq 8A}$$

$$I_{cs} = I_{cs}(p) + I_{es}(n) \quad \text{Eq 8B}$$

For the particular TEBT specified in Table 1, the emitter length $W_e$, base thickness $W_b$ and collector length $W_c$ are all small in comparison with their respective carrier diffusion lengths. Consequently, $I_{es}$ and $I_{cs}$ can be expressed in terms of the doping concentrations $N_a$, $N_{de}$ and $N_{dc}$, the hole and electron diffusion constants $D_p$ and $D_n$ and the hole and electron tunneling probabilities $T_p$ and $T_n$, by $$I_{es} = A_e qn_i^2[D_p R_p/W_e N_{de} + D_n R_n/W_b N_a] \approx \quad \text{Eq 9A}$$
$$A_e qn_i^2[(D_p/W_e N_{de})\exp(-E_v/kT) + D_n R_n/W_b N_a]$$

-continued $$I_{cs} = A_c q n_i^2 [D_p/W_c N_{dc} + D_n/W_b N_a] \qquad \text{Eq 9B}$$

where $n_i$ is the intrinsic carrier concentration of GaAs and Eq 4 and Eq 5 are used.

Assuming that the depletion-layer recombination currents are much larger than the neutral-base recombination currents, the common base forward and reverse current gain factors $\alpha_f$ and $\alpha_r$ can be written as $$\alpha_f = I_{es}(n)/[I_{es}(n) + I_{es}(p) + (I_{er} + A_e q n_i W_{be}/\tau_{be}) \exp(-qV_{be}/kT)] \qquad \text{Eq 10A}$$

$$\alpha_r = I_{cs}(n)/[I_{cs}(n) + I_{cs}(p) + (I_{cr} + A_c q n_i W_{bc}/\tau_{bc}) \exp(-qV_{bc}/kT)] \qquad \text{Eq 10B}$$

Consequently the common emitter current gain may be found as $$\begin{aligned}\beta &= \alpha_f/[1 - \alpha_f] \qquad \text{Eq 11}\\ &= I_{es}(n)/[I_{es}(p) + (I_{er} + (A_e q n_i W_{be}/\tau_{be}) \exp(-qV_{be}/kT)]\end{aligned}$$

If the recombination current $I_{er}$ is negligible in comparison with $I_{es}(p)$, such as in the case of large $V_{be}$, we may estimate $\beta$ according to $$\begin{aligned}\beta &\approx I_{es}(n)/I_{es}(p) \qquad \text{Eq 12}\\ &\approx (D_n W_e N_{de}/D_p W_b N_a) R_n/R_p\\ &\approx 400 \times 0.1 \times \exp(\Delta E_v/kT)\\ &\approx 2500\end{aligned}$$

where the parameters in Table 1 are used.

This current gain may be further enhanced by the ballistic transport of hot electrons across the base as was originally proposed by H. Kroemer, "Heterostructure bipolar transistors: What should we build?", *J. Vac. Sci. Technol.*, Vol. Bl, No. 2, pp 126–130, April–June 1983.

Just as in a conventional HBT, the base doping level in TEBT 10 may be quite high, leading to a low base spreading resistance, low emitter-base capacitance and other factors favorable for a high frequency performance.

The TEBT 10 of the present invention offers a significantly higher cut-off frequency than is possible with state-of-the-art HBT devices. The reason is the high contact resistance to N type $Al_xGa_{1-x}As$ emitters. As stated by H. Yuan, W. McLevige and H. D. Shih, *VLSI Electronics*, Vol. 11, ed. by Einspruch and W. Wisseman, Academic Press, Inc. 1985: "Taking the state of the art heterojunction bipolar transistor made from AlGaAs-GaAs as an example, it has a measured $f_T$ of 25 GHz, although the calculated value indicates that the $f_T$ should be as high as 65 GHz. This disparity is identified, because of the difficulty of making low-contact resistance to the AlGaAs emitter. Therefore, to achieve ultra-high switching speed . . . the emitter resistance must also be reduced proportionally."

By contrast, in TEBT 10, the emitter resistance is substantially reduced because of the use of highly doped GaAs as emitter 16. The emitter contact resistance $R_{econ}$ is much lower for TEBT 10 in comparison to the conventional HBT, and as a result a much higher cut-off frequency is achieved.

For high base currents (i.e. large base emitter voltages $V_{be}$), the cut-off frequency is given by:

$$f_T = \tfrac{1}{2}\pi[R_{econ}(C_{je} + C_{parastic}) + W_b^2/2D_e] \qquad \text{Eq 13}$$

where $R_{econ}$ is the emitter contact resistance, $C_{je}$ the emitter-base junction capacitance, and $C_{parastic}$ is the total parasitic capacitance that includes the collector-base junction capacitance, device isolation capacitance, and interconnect capacitance. The intrinsic base transit time is given by the second term in the bracket. As can be seen from Eq 13, TEBT 10 will have higher cut-off frequency $f_T$ due to the much lower $R_{econ}$ in TEBT 10, if everything else is kept the same as in a conventional heterojunction bipolar transistor. Taking the parameters given in Table 1, we have:

$$\begin{aligned}R_{econ} &= R_{con} + R_e \qquad \text{Eq 14}\\ &\approx 5 \times 10^{-7} + (W_e/qN_{de}\mu_e)\\ &\approx 5 \times 10^{-7} + 5.7 \times 10^{-8}\\ &\approx 6 \times 10^{-7} \ (\Omega\text{-cm}^2)\end{aligned}$$

where the contact resistance $5 \times 10^{-7} \Omega$–cm$^2$ is assumed for the ohmic contacts to GaAs.

$$W_b^2/D_e \approx 2 \times 10^{-13} \text{ second} \qquad \text{Eq 15}$$

The capacitances are approximately $$C = C_{ie} + C_{parasitic} \approx 3 \times 10^{-6} F/cm^2 \qquad \text{Eq 16}$$

and hence, $$f_T \approx 80 \text{ GHz.} \qquad \text{Eq 17}$$

For a conventional heterojunction bipolar transistor with AlGaAs emitter, $R_{econ}$ is higher (perhaps, not lower than $2. \times 10^{-6} \Omega$-cm$^2$). Hence, for the devices with similar parameters, $$f_{T(AlGaAs)} \approx 26 \text{ GHz}$$

in approximate agreement with H. Yuan et al.

Although TEBT 10 has been described in terms of a GaAs device with an AlGaAs barrier layer 24, other combinations of semicondutor materials can be used to achieve similar device properties. TEBT 10 requires a large difference in the effective electron mass and the effective hole mass, a small barrier to the majority carriers, and good lattice matching between barrier layer 24 and the materials of base 14 and emitter 16.

In another embodiment, AlGaAs is the material for barrier layer 24, and InGaAs is the material used for collector 12, base 14, and emitter 16. Similar conduction band discontinuities to AlGaAs/GaAs can be realized with a low mole fraction in the AlGaAs. There is a high electron mobility in InGaAs, and the mass difference between electrons and holes is large. A thin AlGaAs layer can resolve the lattice mismatching due to the fact that the lattice strain is taken up coherently by epilayers resulting in a dislocation-free pseudomorphic material.

Still another material system is InAlAs/InGaAs, where InAlAs is the material used for barrier layer 24. The characteristics are similar to those of AlGaAs/InGaAs.

Another material system uses InGaP as the barrier layer 24 and GaAs as the material for collector 12, base 14, and emitter 16. The conduction band discontinuity at interface 28 is approximately equal to the valence band discontinuity.

Still another material system is AlGaAs/GaAs/GaBeAs. In this embodiment, AlGaAs is the material of barrier layer 24, GaAs is the material used for collector 12 and emitter 16. GaBeAs is used as the material for base 14, which allows ultra high doping in base 14.

In conclusion, the tunnelling emitter bipolar transistor (TEBT) of the present invention offers high emitter efficiency, low parasitic resistance, and significantly higher frequency performance than is possible with state-of-the-art heterojunction bipolar transistors. In addition, since the emitter of the TEBT is a material such as GaAs, the temperature instability, light sensitivity, and other undesirable effects associated with the heavily doped AlGaAs emitter of a HBT are significantly reduced.

Although the present invention has been described with reference to preferred embodiments, workers skilled in the art will recognize that changes may be made in form and detail without departing from the spirit and scope of the invention.

What is claimed is:

1. A bipolar transistor comprising:
   a collector having a first conductivity type;
   a base having a highly doped second conductivity type;
   an emitter having the first conductivity type; and
   a barrier layer interposed between the base and the emitter, the barrier layer being heavily doped, first conductivity type, having a wider band gap than the emitter, and exhibiting a difference in effective electron mass and effective hole mass, the barrier layer having a thickness such that the barrer layer is substantially transparent to first conductivity type carriers and having a compositional gradient where the band gap varies as a function of distance from a junction between the base and the barrier layer to enhance tunneling in the barrier layer.

2. The bipolar transistor of claim 1 wherein the barrier layer is formed by an alloy semiconductor which has a band gap which is a function of composition.

3. The bipolar transistor of claim 1 wherein the band gap of the barrier layer increases with the distance from the junction.

4. The bipolar transistor of claim 3 wherein band gaps of the barrier layer and the base are essentially equal at the junction.

5. The bipolar transistor of claim 1 wherein the emitter is heavily doped, first conductivity type.

6. The bipolar transistor of claim 1 wherein the collector and the emitter are formed by a first semiconductor material and the barrier layer is formed by a second alloy semiconductor material.

7. The bipolar transistor of claim 6 wherein the base is formed by the first semiconductor material.

8. The bipolar transistor of claim 6 wherein the base is formed by a third semiconductor material.

9. The bipolar transistor of claim 8 wherein the first semiconductor material is GaAs, the second semiconductor material is AlGaAs, and the third semiconductor material is GaBeAs.

10. The bipolar transistor of claim 6 wherein the first semiconductor material is GaAs.

11. The bipolar transistor of claim 10 wherein the second semiconductor material is AlGaAs.

12. The bipolar transistor of claim 10 wherein the second semiconductor material is InGaP.

13. The bipolar transistor of claim 6 wherein the first semiconductor material is InGaAs.

14. The bipolar transistor of claim 13 wherein the second semiconductor material is AlGaAs.

15. The bipolar transistor of claim 13 wherein the second semiconductor material is InAlAs.

16. The bipolar transistor of claim 1 wherein the barrier layer has a thickness of between about 10 Angstroms and about 200 Angstroms.

17. The bipolar transistor of claim 1 wherein the barrier layer has a thickness of between about 30 Angstroms and about 60 Angstroms.

18. The bipolar transistor of claim 1 wherein the first conductivity type is n type and the second conductivity type is p type.

19. The bipolar transistor of claim 1 wherein the barrier layer exhibits a large barrier to minority carrier injection than to majority carrier injection.

* * * * *

UNITED STATES PATENT AND TRADEMARK OFFICE
CERTIFICATE OF CORRECTION

PATENT NO. : 4,845,541

DATED : July 4, 1989

INVENTOR(S) : Jingming Xu et al.

It is certified that error appears in the above-identified patent and that said Letters Patent is hereby corrected as shown below:

Column 8, line 43, delete "large" and insert --larger--.

Signed and Sealed this

Seventeenth Day of April, 1990

Attest:

HARRY F. MANBECK, JR.

*Attesting Officer*  *Commissioner of Patents and Trademarks*